US011018192B2

United States Patent
Ando et al.

(10) Patent No.: US 11,018,192 B2
(45) Date of Patent: May 25, 2021

(54) REDUCTION OF METAL RESISTANCE IN VERTICAL RERAM CELLS

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/741,786

(22) Filed: Jan. 14, 2020

(65) Prior Publication Data

US 2020/0152702 A1   May 14, 2020

Related U.S. Application Data

(62) Division of application No. 16/021,062, filed on Jun. 28, 2018, now Pat. No. 10,580,829.

(51) Int. Cl.
*H01L 27/24* (2006.01)
*H01L 45/00* (2006.01)

(52) U.S. Cl.
CPC ........ *H01L 27/249* (2013.01); *H01L 45/1233* (2013.01); *H01L 45/1253* (2013.01);
(Continued)

(58) Field of Classification Search
CPC .. H01L 27/249; H01L 45/1608; H01L 45/146
See application file for complete search history.

(56) References Cited

U.S. PATENT DOCUMENTS

| 8,853,821 B2 | 10/2014 | Kim et al. |
| 8,872,149 B1 | 10/2014 | Hsieh et al. |

(Continued)

FOREIGN PATENT DOCUMENTS

| CN | 103843120 A | 6/2014 |
| CN | 104733612 A | 6/2015 |

OTHER PUBLICATIONS

List of IBM Patents or Patent Applictions Treated as Related; (Appendix P), Filed Jan. 14, 2020, 2 pages.

(Continued)

*Primary Examiner* — Quoc D Hoang
(74) *Attorney, Agent, or Firm* — Cantor Colburn LLP; Randall Bluestone

(57) ABSTRACT

Embodiments of the invention include resulting structures and a method for fabricating a vertical ReRAM array structure. The embodiments of the invention include forming alternating layers over a metal layer of a structure, wherein a layer of the alternating layers comprises a low resistivity material, masking one or more portions of a topmost layer of the alternating layers, and etching one or more portions of the alternating layers down to the metal layer. Embodiments of the invention also include depositing a lateral electrode layer over the etched one or more portions of the alternating layers, performing an etch back on the lateral electrode layer, and forming a vertical electrode layer over the structures.

18 Claims, 12 Drawing Sheets

(52) U.S. Cl.
CPC ........ *H01L 45/146* (2013.01); *H01L 45/1608* (2013.01); *H01L 45/1675* (2013.01)

(56) References Cited

U.S. PATENT DOCUMENTS

| | | |
|---|---|---|
| 9,257,642 B1 | 2/2016 | Chang et al. |
| 2015/0364488 A1 | 12/2015 | Pachamuthu |
| 2016/0308004 A1* | 10/2016 | Lee ................. H01L 29/165 |
| 2016/0343721 A1 | 11/2016 | Briggs et al. |
| 2016/0351497 A1* | 12/2016 | Peri ................ H01L 27/11582 |
| 2017/0154895 A1* | 6/2017 | Huo ................ H01L 27/11582 |

OTHER PUBLICATIONS

Takashi Ando et al., Pending U.S. Appl. No. 16/021,062 entitled "Reduction of Metal Resistance in Vertical ReRAM Cells," filed with the U.S. Patent and Trademark Office Jun. 28, 2018.

\* cited by examiner

REDUCTION OF METAL RESISTANCE IN VERTICAL RERAM CELLS

DOMESTIC PRIORITY

This application is a Divisional of U.S. patent application Ser. No. 16/021,062, filed Jun. 28, 2018, the content of which is incorporated by reference herein in its entirety.

BACKGROUND

The present invention generally relates to resistive switching devices (RSDs). More specifically, the present invention relates to fabrication methodologies and resulting structures for forming vertical resistive random access memory (ReRAM) cells that reduce the metal resistance of the vertical and lateral electrodes.

ReRAM is a nano-scale non-volatile memory (NVM). ReRAM provides simple storage cell components, high density, low power, large endurance, fast write, read and erase speeds, and excellent scalability. A typical ReRAM storage cell is two-terminal device formed as a metal-insulator-metal (MIM) structure. The insulator material can be a binary metal oxide, which makes the MIM storage cell compatible with silicon-based CMOS (complementary metal oxide semiconductor) fabrication process. When a sufficient electrical signal is applied across the metal electrodes of a MIM, the resistance of the insulator can be switched from one resistance state to another. The insulator retains its current resistance state until an appropriate electrical signal is applied across the metal electrodes to change it.

ReRAM, along with the logic circuitry used to address, read and write individual ReRAM cells, can be implemented in an array (e.g., a ReRAM cell array), which is compatible with a variety of electronic circuits and devices, including neuromorphic architectures. Multiple pre-neurons and post-neurons can be connected through the array of ReRAMs, which naturally expresses a fully-connected neural network. The density of ReRAM can be increased by configuring the array as a three-dimensional (3D) vertical stack of addressable ReRAM cells as practiced in Flash NAND technologies.

SUMMARY

Embodiments of the present invention are directed to a method for reduction in metal resistance in vertical ReRAM structure. A non-limiting example of the method includes forming alternating layers over a metal layer of a structure, wherein a layer of the alternating layers comprises a low resistivity material, masking one or more portions of a topmost layer of the alternating layers, and etching one or more portions of the alternating layers down to the metal layer. The method also includes depositing a lateral electrode layer over the etched one or more portions of the alternating layers, performing an etch back on the lateral electrode layer, and forming a vertical electrode layer over the structures.

Embodiments of the present invention are directed to a device comprising a reduction in metal resistance in vertical ReRAM structure. A non-limiting example of the system includes a plurality of vertical electrodes, a plurality of lateral electrodes, wherein the cross section of the vertical electrode and the lateral electrode forms active regions having a switchable conduction state, wherein the lateral electrode wraps-around the vertical electrode and wherein the lateral electrode and vertical electrode comprises a low resistivity conductor, and a plurality of active regions having a switchable conduction state.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 4-11 depict cross-sectional views, taken along line A-A of FIG. 3, illustrating a 3D vertical ReRAM array after fabrication operations according to aspects of the invention, in which:

FIG. 4 depicts a cross-sectional view of the 3D vertical ReRAM array after fabrication operations according to aspects of the invention;

FIG. 5 depicts a cross-sectional view of the 3D vertical ReRAM array after fabrication operations according to aspects of the invention;

FIG. 6 depicts a cross-sectional view of the 3D vertical ReRAM array after fabrication operations according to aspects of the invention;

FIG. 7 depicts a cross-sectional view of the 3D vertical ReRAM array after fabrication operations according to aspects of the invention;

FIG. 8 depicts a cross-sectional view of the 3D vertical ReRAM array after fabrication operations according to aspects of the invention;

FIG. 9 depicts a cross-sectional view of the 3D vertical ReRAM array after fabrication operations according to aspects of the invention; and FIG. 10 depicts a cross-sectional view of the 3D vertical ReRAM array after fabrication operations according to aspects of the invention;

FIG. 11 depicts a cross-sectional view of the 3D vertical ReRAM array after fabrication operations according to aspects of the invention.

Figure 1B:
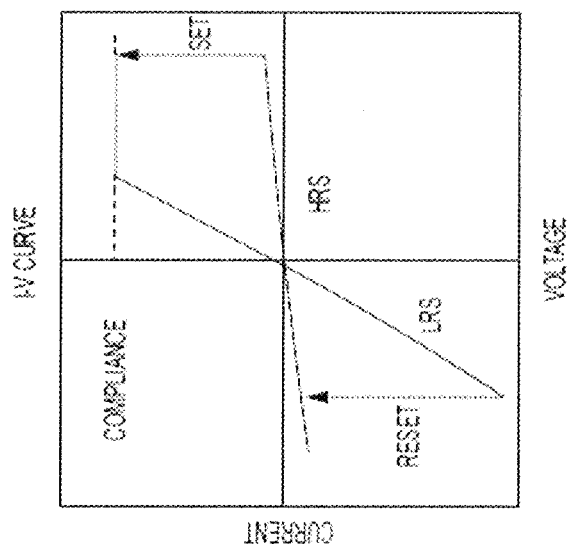
FIG. 1B depicts a diagram of an I-V curve illustrating the switching operation of the RSD component shown in FIG. 1A.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that, although this description includes a detailed description of the formation and resulting structures for a specific type of RSD, implementation of the teachings recited herein are not limited to a particular type of RSD or IC architecture. Rather embodiments of the present invention are capable of being implemented in conjunction with any other type of RSD (e.g., phase change memory, spin-transfer torque memory, and the like) or IC architecture, now known or later developed.

For the sake of brevity, conventional techniques related to making and using aspects of the invention may or may not be described in detail herein. In particular, various aspects of conventional techniques related to semiconductor device and integrated circuit (IC) fabrication are well-known so may or may not be described in detail herein. Accordingly, in the interest of brevity, many conventional implementation details are only mentioned briefly herein or are omitted entirely without providing the well-known system and/or process details.

Turning now to an overview of technologies that are more specifically relevant to aspects of the present invention, with the growth of digital data applications, there is a need for increasingly fast and scalable memory technologies for data storage and data-driven computation. ReRAM is a high speed, high density, and low fabrication-cost NVM technology. Thus, ReRAM has the potential to replace and/or complement the limited scaling of flash memories and other silicon-based memories such as dynamic random access memory (DRAM) and static random access memory (SRAM).

A typical ReRAM storage cell is a two-terminal device formed as a metal-insulator-metal (MIM) structure, which is a simpler construction than the three terminal storage cells used in conventional CMOS-based DRAM or flash memory. The insulator material in the MIM can be a binary metal oxide, which makes fabricating a MIM ReRAM storage cell compatible with silicon-based CMOS fabrication process. The resistance of an ReRAM storage cell serves as the switchable conduction state that stores data. When a sufficient electrical field/signal is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration ($V_O$) in the oxide of the binary metal oxide and the state of the insulator/electrode interface are significant factors in controlling the resistive switching mechanism in a MIM memory cell. Thus, it is desirable to use insulators in the form of oxides with a high mobility of oxygen vacancies (e.g., single-layer non-stoichiometric or double-layer oxide structures with ionic bonding).

Because each ReRAM storage cell uses only two external terminals, these memories can be accommodated in an array (e.g., the crossbar array 200 shown in FIG. 2, and the vertical ReRAM array 300 shown in FIG. 3), which is compatible with a variety of electronic circuits and devices, including ultra-high density NVM and artificial neural network (ANN) architectures. A basic array includes a set of conductive row electrodes and a set of conductive column electrodes formed to intersect the set of conductive row electrodes. The intersections between the two sets of electrode lines are separated by a so-called "cross-point" device, which, in ReRAM memory circuits, can be implemented as a two-terminal MIM RSD. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

In neuromorphic computing applications (e.g., ANN), an RSD can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of ReRAMs, which naturally expresses a fully-connected neural network.

The density of MIM ReRAMs in an array can be increased by forming the array as a 3D stack of ReRAM cells as practiced in Flash NAND technology. A vertical ReRAM array (e.g., the vertical ReRAM array 300 shown in FIG. 3) is an example of a 3D array. In a vertical ReRAM, a stack of horizontal plates serves as shared bottom electrodes, and vertical electrodes (e.g., a conductive pillar) extend through an openings/vias in the stack of horizontal plates to serve as shared top electrode. A metal oxide is wrapped around each of the vertical electrodes such that both the metal oxide and the vertical electrode occupy each opening/via in the stacked horizontal plates. An individual ReRAM cell/stack of the vertical ReRAM array is defined at each intersection between a horizontal plate (bottom electrode) and a vertical electrode (top electrode). The metal oxide of each individual ReRAM cell/stack is the portion of the metal oxide that is around the vertical electrode at the horizontal/vertical electrode intersection.

In general, the vertical electrode and metal oxide of a MIM cell/stack (e.g., MIM stack 100 shown in FIG. 1A) can be deposited by physical vapor deposition (PVD) in order to control the oxygen vacancy concentration in the metal oxide layer. However, it is difficult to apply PVD fabrication techniques to 3D structures. Atomic layer deposition (ALD) has been proposed as a method to deposit the metal oxide around the vertical electrode. However, as the opening/via diameter is reduced due to scaling, the resistivity of the vertical electrodes become high due to limited area for metal deposition.

An example of the problems addressed by aspects of the invention arise in a 3D array of RSDs, wherein some RSDs in the array are positioned at distances far away from contacts points that provide signals to access the array. Using known 3D arrays, signals into and away from the RSDs experience a resistance level that is proportional to the distances between the RSDs and the contact points. Because these distances vary, the associated resistance levels vary, and the different levels of resistances cause unpredictable behavior in the 3D array. For example, an array having a size of 3000×3000, the conductive signal path leading to ReRAM cells that are the furthest away from the contact will experience higher resistances when compared to those that are located closer to the contact. All the devices should have the same/similar resistivity for predictable functionality as a memory device. The conductive materials that are used to carry the signals to the ReRAM cells exhibit resistivity variations at different locations of the array. Previous methods have used tungsten as the lateral electrode coupled to the ReRAM cell, however inconsistent resistances were experienced at distances far away from the contact points.

Turning now to an overview of the aspects of the invention, one or more embodiments of the invention address the above-described shortcomings of the prior art by including low resistivity materials in the horizontal access plates and vertical electrodes that are coupled to the ReRAM structure. The materials can include copper which reduces the resistivity variations experienced by one or more ReRAM cells that are located a distance away from the contacts providing a bias signal to read/write to the cells. In one or more embodiments of the invention, the vertical electrodes of the ReRAM structure include a three-layer configuration including a transitional oxide layer, an alloy layer and a barrier layer. The transitional oxide layer and the alloy layer can form the cell which holds the state if the cell is accessed by the vertical/lateral electrodes. In embodiments of the invention, hafnium oxide is used for the transitional oxide layer, titanium nitride is used for the lateral electrode, and copper is used for the access plate providing the conductive path from the contact point to the lateral electrode that is coupled to the cell. The barrier layer is used to stop the copper layer from diffusing into the neighboring layers and preserve the functionality of the cells. The properties of copper provide lower resistivity properties when compared to the previously used material in the art such as tungsten and only titanium nitride along.

Figure 1A:
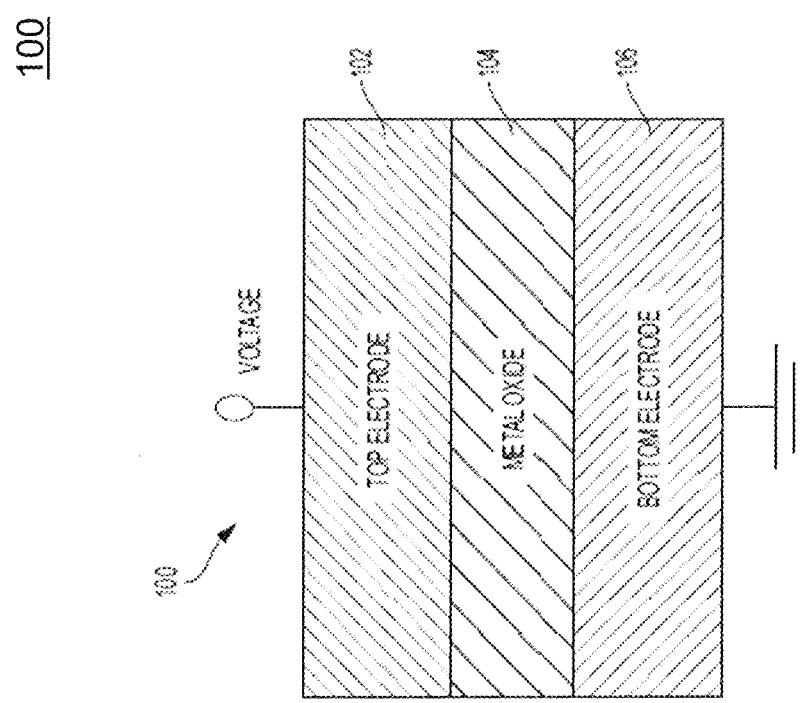
FIG. 1A depicts a simplified block diagram illustrating a cross-sectional view of a two-terminal resistive switching device (RSD), which can be used as a storage cell of an RERAM structure capable of incorporating aspects of the invention.

FIG. 1A depicts a simplified block diagram illustrating a cross-sectional view of a two-terminal RSD component 100, which can be used as a storage cell of an ReRAM structure (e.g., crossbar array 200 shown in FIG. 2 or 3D vertical ReRAM 300 shown in FIG. 3) capable of incorporating aspects of the invention. The RSD storage cell 100 includes a top electrode 102, metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of ReRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of current conducting filament (CF) and the corresponding LRS resistance value.

Figure 2:
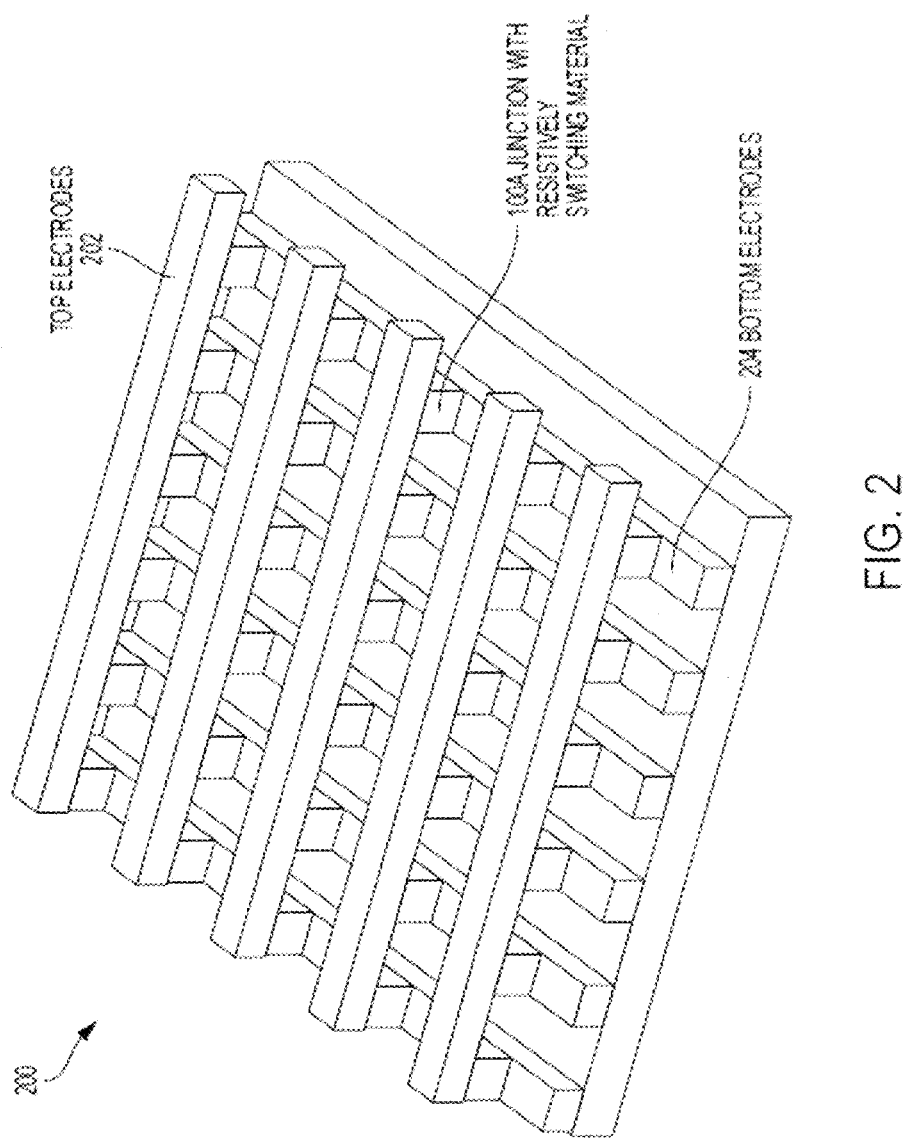
FIG. 2 depicts a simplified block diagram illustrating how the RSD component shown in FIG. 1A can be utilized as an addressable ReRAM cells of an ReRAM crossbar array capable of incorporating aspects of the invention.

FIG. 2 depicts a simplified block diagram illustrating how the RSD storage cell 100 shown in FIG. 1A can be utilized as an addressable cross-point storage cell 100A of an ReRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. In embodiments of the invention, the storage cell 100A can be configured to operate the same as the storage cell 100 shown in FIG. 1A. Each storage cell 100A can be accessed for read and write by biasing the corresponding top electrode line 202 and bottom electrode line 204.

Figure 3:
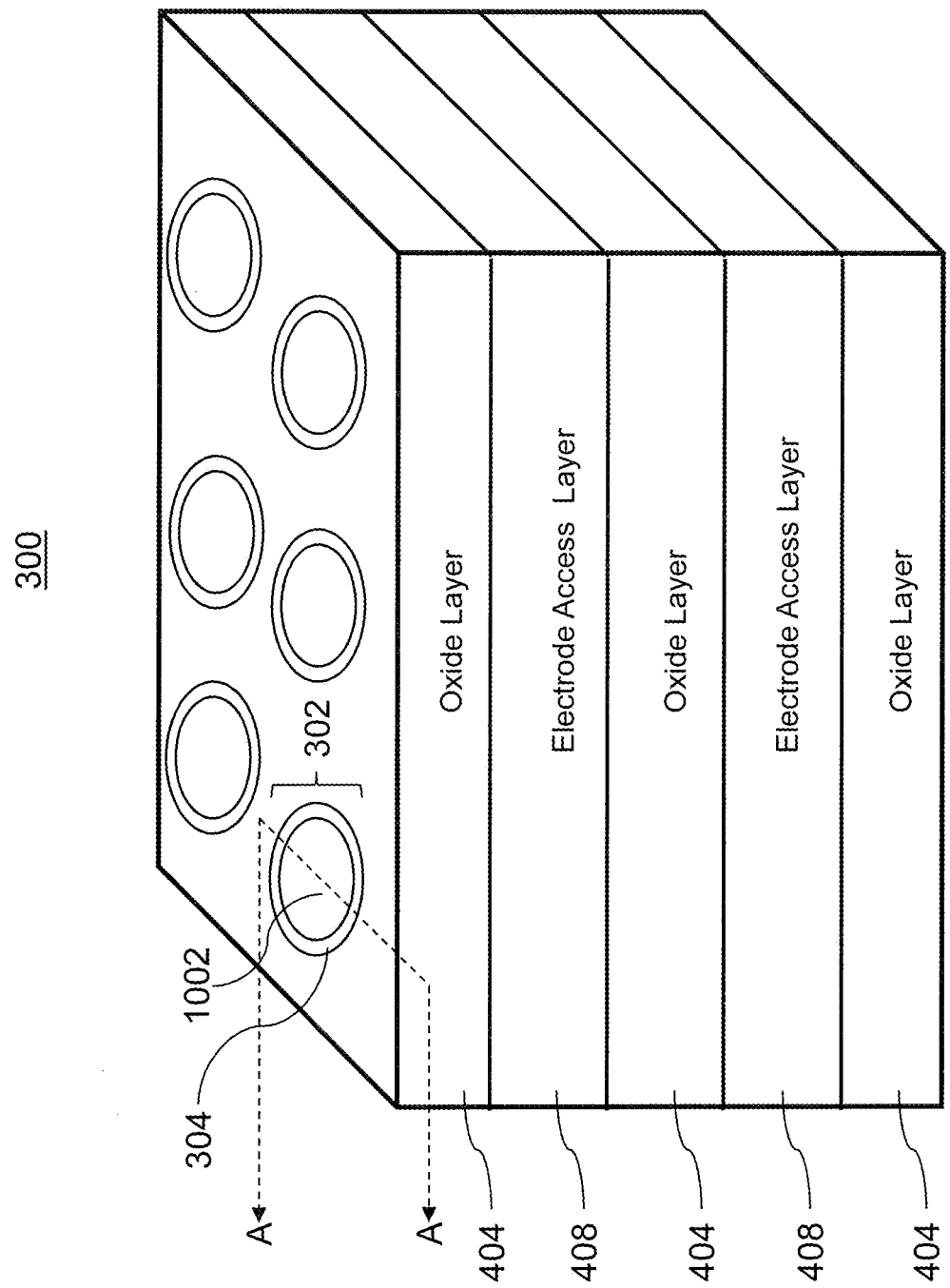
FIG. 3 depicts a simplified block diagram illustrating a 3D vertical ReRAM array capable of incorporating aspects of the invention.
Figure 9:
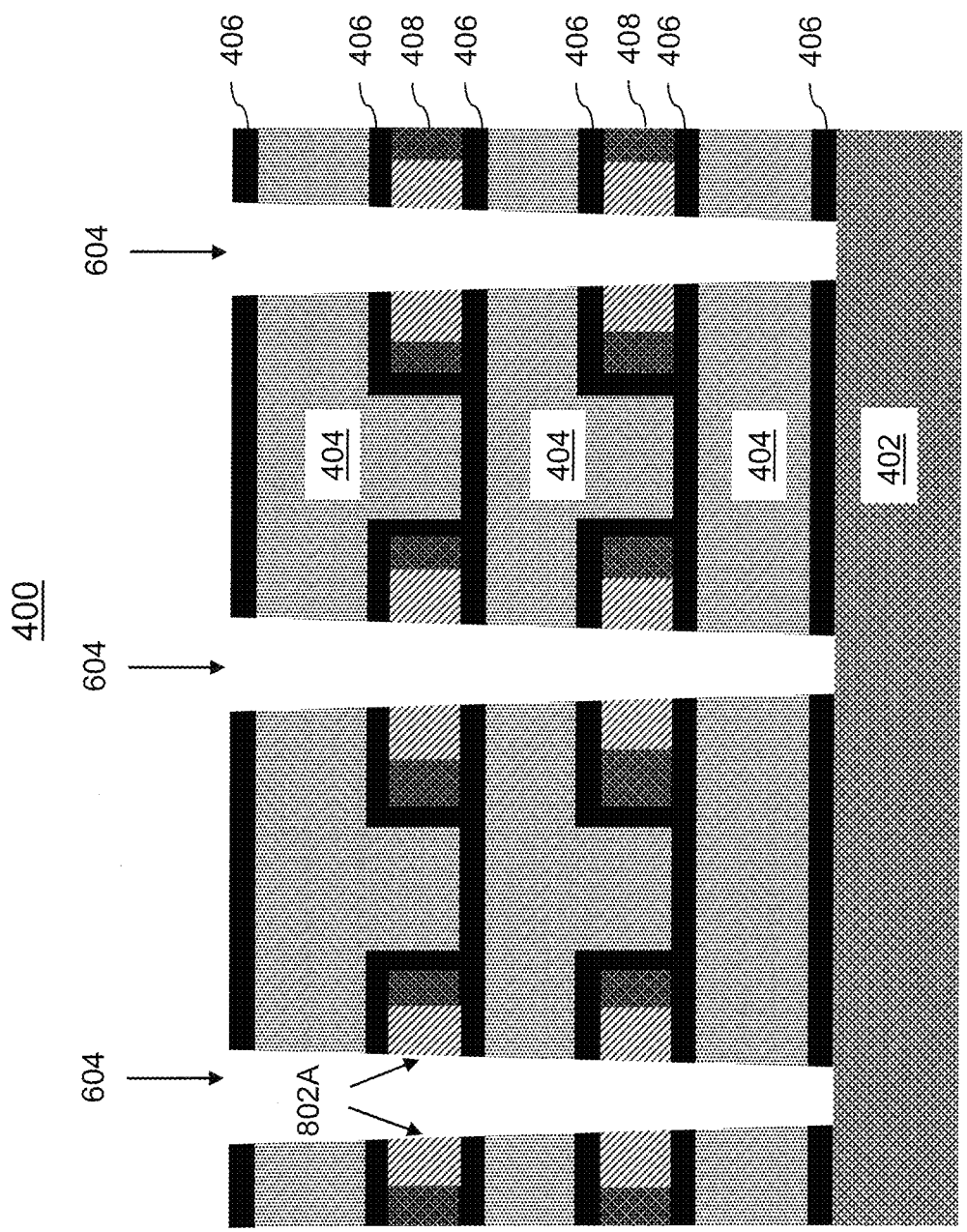

FIG. 3 depicts a block diagram illustrating how storage cells can be utilized as an addressable memory of a 3D ReRAM array 300 capable of incorporating aspects of the invention. The 3D ReRAM array 300 includes a stack formed from alternating layers of oxide layers 404 and electrode access layers/electrodes 408. For ease of illustration and explanation, only two electrode access layers/ electrodes 408 and three oxide layers 404 are shown in FIG. 3. However, aspects of the invention can be applied to a stack having any number of oxide layers and electrode access layers/electrodes. Multiple vertical electrodes 302 extend through each opening/via 504. The vertical electrode material 1002 is fills the opening to form the vertical electrodes 302. In addition, a layer 304 is shown surrounding the vertical electrode material 1002. In one or more embodiments of the invention, the layer 304 includes three layers including a transitional oxide layer 902, an alloy layer 904, and a barrier layer 906 as shown in FIG. 9. For ease of illustration and explanation, only vertical electrodes 302 are shown in FIG. 3. However, aspects of the invention can be applied to a stack having any number of vertical electrodes 302 and openings/vias 504. In accordance with aspects of the invention, the lateral electrode are not present within the openings/vias 504, but are instead formed as part of the electrode access layer 408 (shown in FIG. 4). Each storage cell of the vertical ReRAM array 300 can be accessed for read and write by biasing the corresponding electrode access layer 408 and vertical electrode 302.

Figure 4:
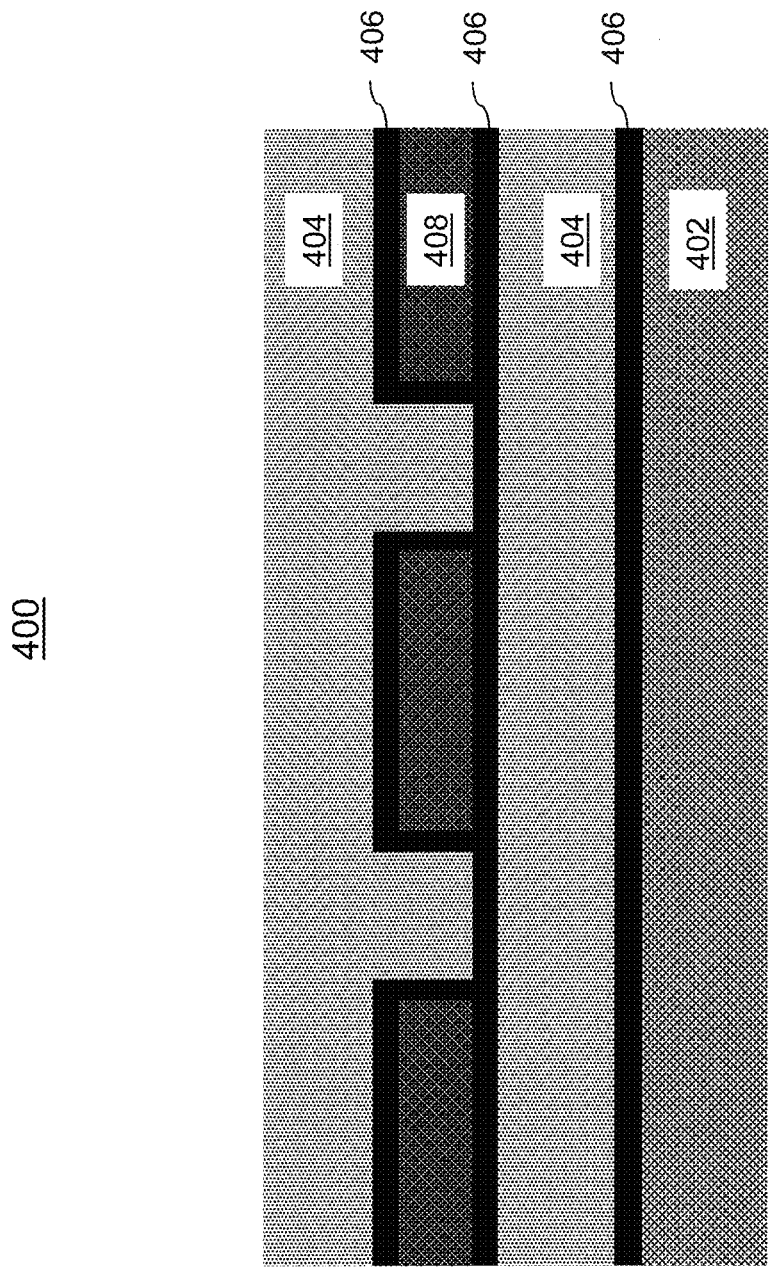
Figure 5:
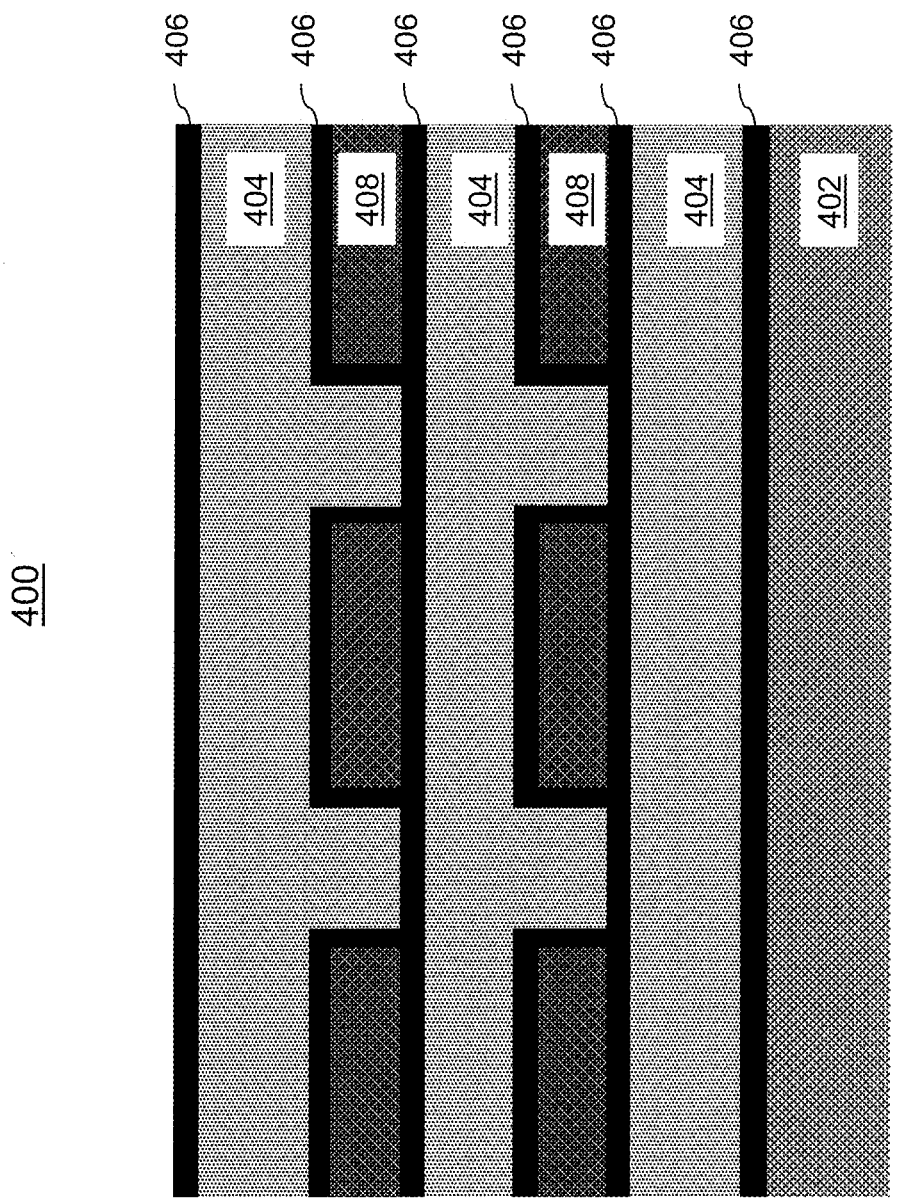

FIGS. 4-11 depict cross-sectional views, taken along line A-A shown in FIG. 3, showing the results of various fabrication operations for forming the vertical ReRAM array 300 (shown in FIG. 3). FIG. 4 depicts a cross-sectional view of a structure 400 after an initial set of fabrication operations according to embodiments of the invention. In FIG. 4, known fabrication operations have been used to form the structure 400 such that it includes a metal layer 402, an oxide layer 404, barrier layers 406, and a lateral electrode access layer 408. In one or more embodiments of the invention, the lateral electrode access layer 408 is includes copper (Cu) that will be coupled to the lateral electrode, and the first and second barrier layers 406 are formed from silicon nitride (SiN). In other embodiments of the invention, tantalum nitride (TaN) can be used for the barrier layers 406 to improve the barrier properties. The barrier layers 406 form top and bottom barrier layers surrounding the lateral electrode access layer 408 and are selected to prevent the Cu of the lateral electrode access layer 408 from diffusing into the neighboring layers during processing, thereby rendering the device inoperable. In one or more embodiments of the invention, the top and bottom barrier layers enable the interlayer oxide layer $SiO_2$ thickness scaling, and therefore, allowing a larger array structure to be implemented. The lateral electrode access layer 408 functions as a horizontal access plate that is coupled to the lateral electrode (not shown) of the ReRAM cell. FIG. 5 depicts a cross-sectional view of structure 400 where layers have been formed. These layers include addition oxide layers 404, barrier layers 406, and lateral electrode access layers 408. Although only two lateral electrode access layers 408 are shown, it should be understood that any number of a number of lateral access layers 408 can be used.

Figure 6:
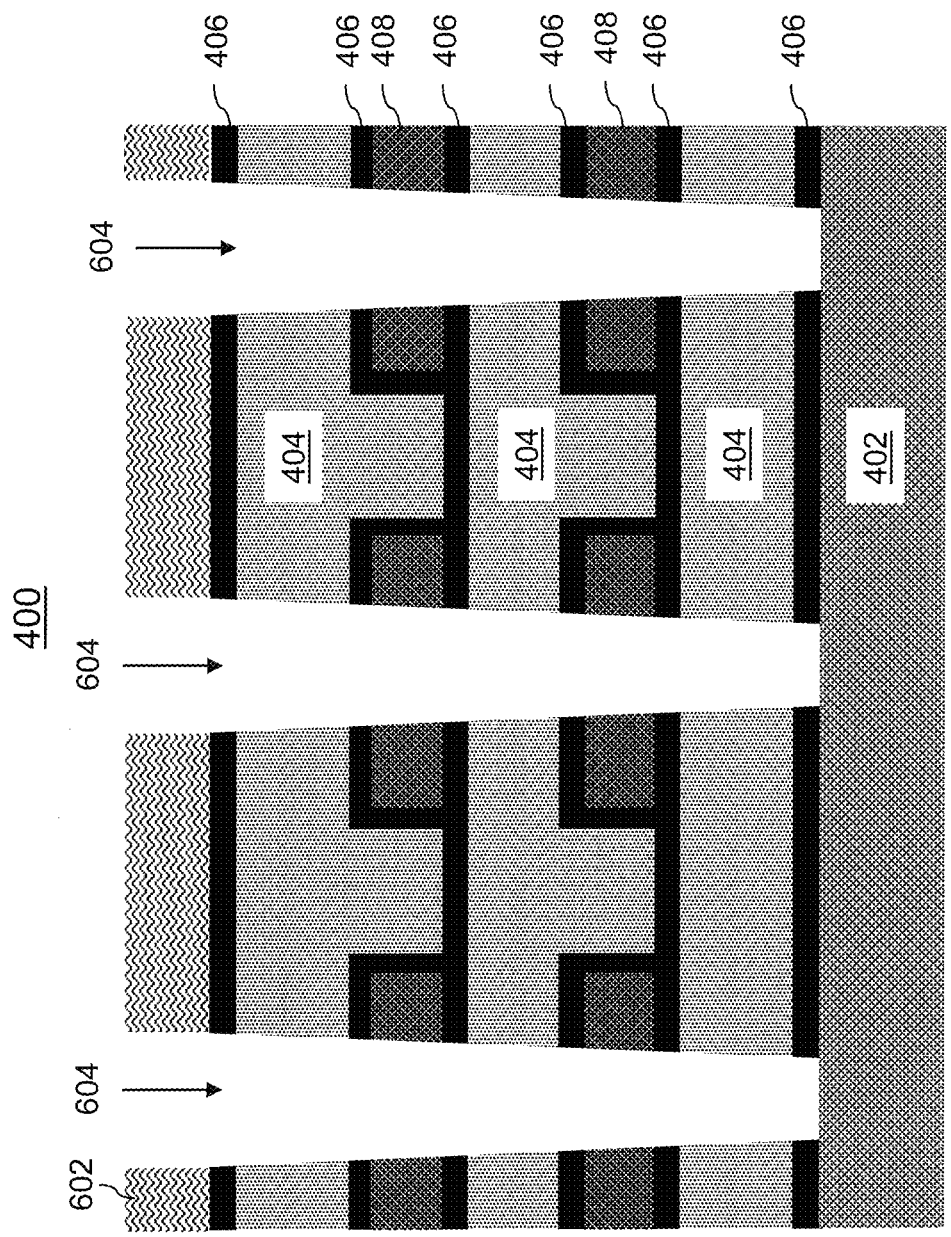

FIG. 6 depicts a cross-sectional view of the structure 400 after a set of fabrication operations according to embodiments of the invention to pattern a hard mask 602 on the top most barrier layer 406, such as the SiN layer. An etching process (e.g., a dry or wet etch process) is performed to form trenches 604.

Figure 7:
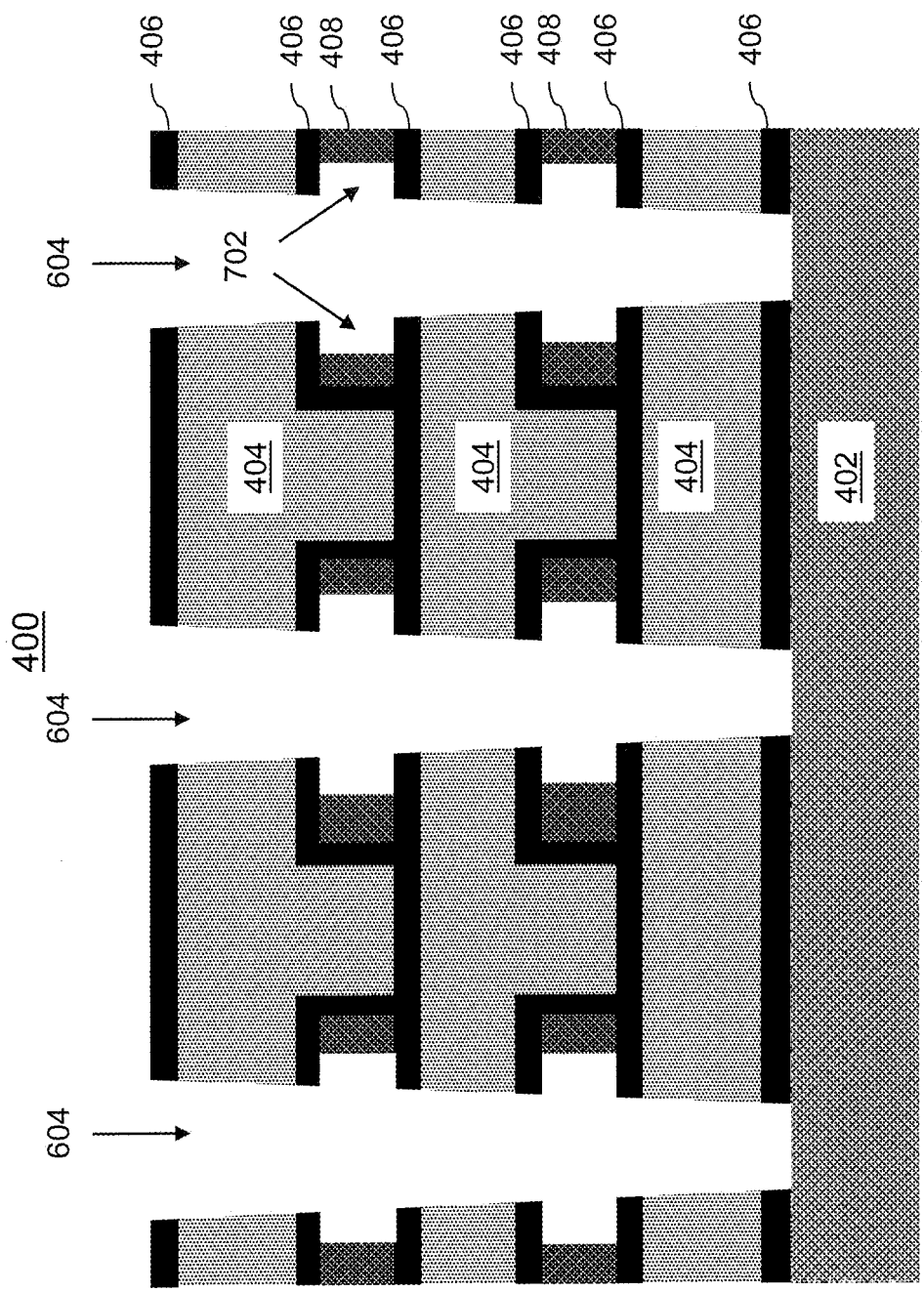

FIG. 7 depicts a cross-sectional view of the structure 400 after a set of fabrication operations according to embodiments of the invention. In FIG. 7, a selective etch has been performed in the trench 604. The selective etch is configured such that the etch rates of the barrier layer 406 and the lateral electrode access layer 408 (lateral electrode layer) exhibit different etch rates resulting in the formation of undercut regions 702.

Figure 8:
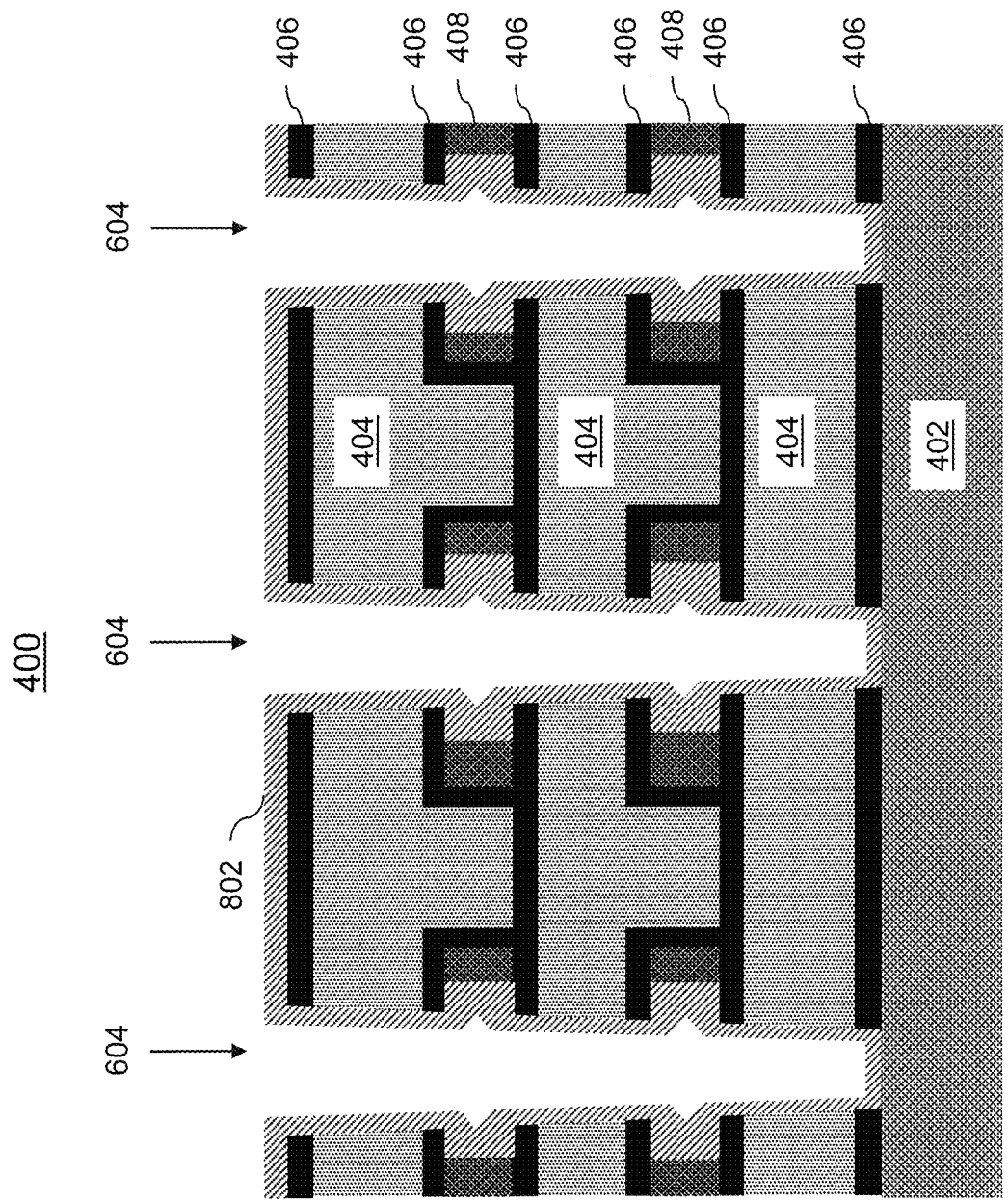

FIG. 8 depicts a cross-sectional view of the structure 400 after a set of fabrication operations according to embodiments of the invention. In FIG. 8, the hard mask layer 602 shown in FIG. 6 has been removed and a layer 802 has been conformally deposited (e.g., by atomic layer deposition (ALD)) on the exposed surfaces of the structure 400, including specifically within the undercut regions 702 (shown in FIG. 7). In one or more embodiments of the invention, the layer 802 is TiN and can be up to 10 nm thick. The TiN layer 802 forms the lateral electrode that wraps around the vertical electrode 1002 discussed with reference to FIG. 10 which is further discussed below.

FIG. 9 depicts a cross-sectional view of the structure 400 after a set of fabrication operations according to embodiments of the invention in which an etch-back process has been used to remove one or more portions of the layer 802 resulting in the structures 802A that fill the undercut regions 702 (shown in FIG. 7). In one or more embodiments of the invention, the etching processing is performed on the TiN layer to reduce the variation in the surfaces between the materials having different etch rates. In an embodiment of the invention, the etching process can be performed to uniformly remove the TiN at an etch rate of approximately 1.2 nm/min.

Figure 10:
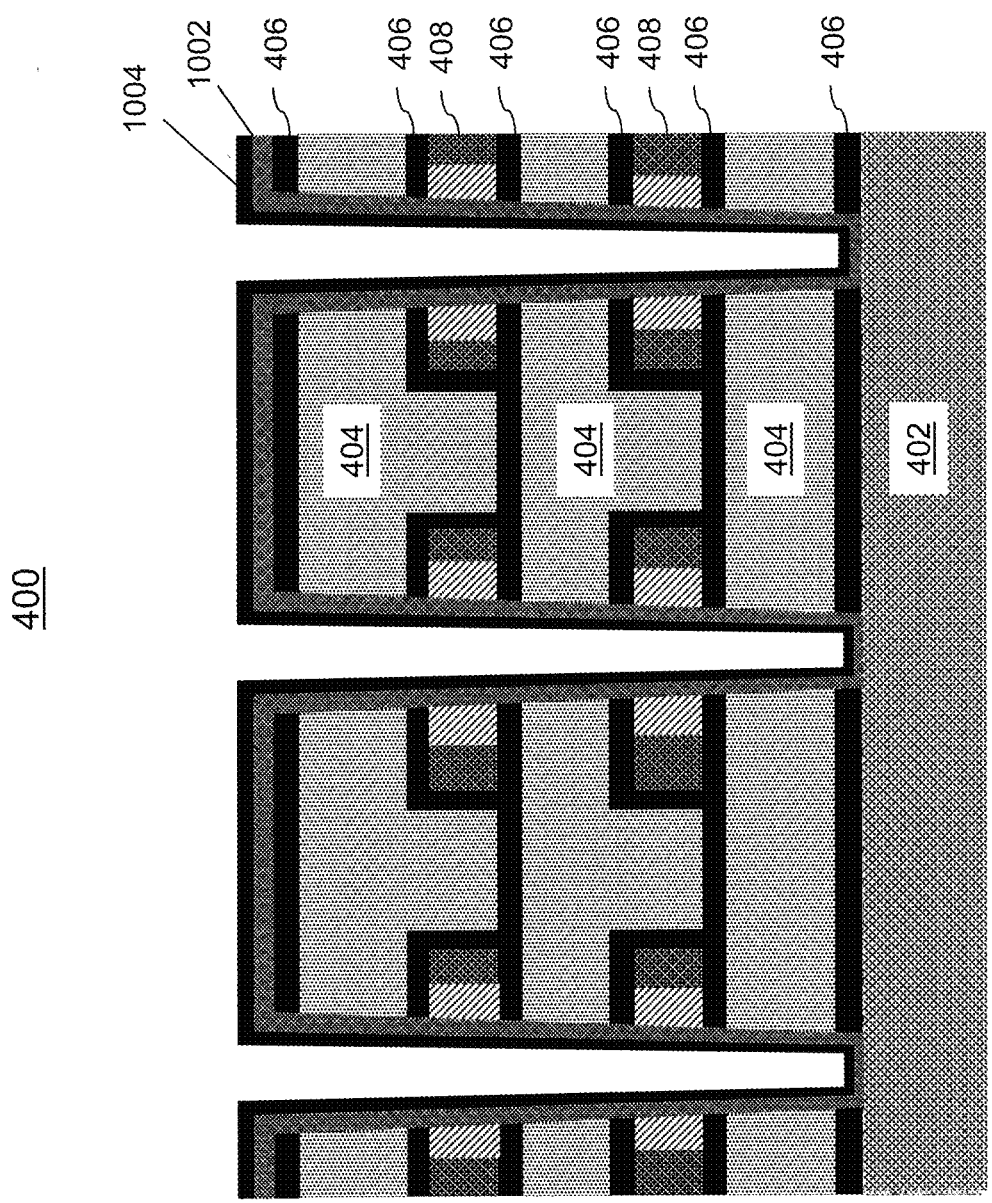

FIG. 10 depicts a cross-sectional view of the structure 400 after a set of fabrication operations according to embodiments of the invention in which known fabrication operations have been used to conformally deposit a first layer (transitional oxide) 1002 on the exposed portions of the structure 400. A second layer (alloy) 1004 is subsequently deposited. The first layer 1002 can be composed of hafnium oxide ($HfO_2$). The hafnium oxide, a high-k dielectric, can be used in the ReRAM cell. It is to be understood that other materials such as tantalum oxide ($Ta_2O_5$) can be used as the transitional oxide layer in the ReRAM cell. In one or more embodiments of the invention, the first layer can be 5 nm-20 nm in thickness. The second layer 1004 is an alloy layer such as titanium aluminum carbon (TiAlC) which is deposited on the transitional oxide layer. The TiAlC layer formed on the transitional oxide layer allows the oxide vacancies to form to hold a state of the memory cell. This interface makes the resistive memory functional.

Figure 11:
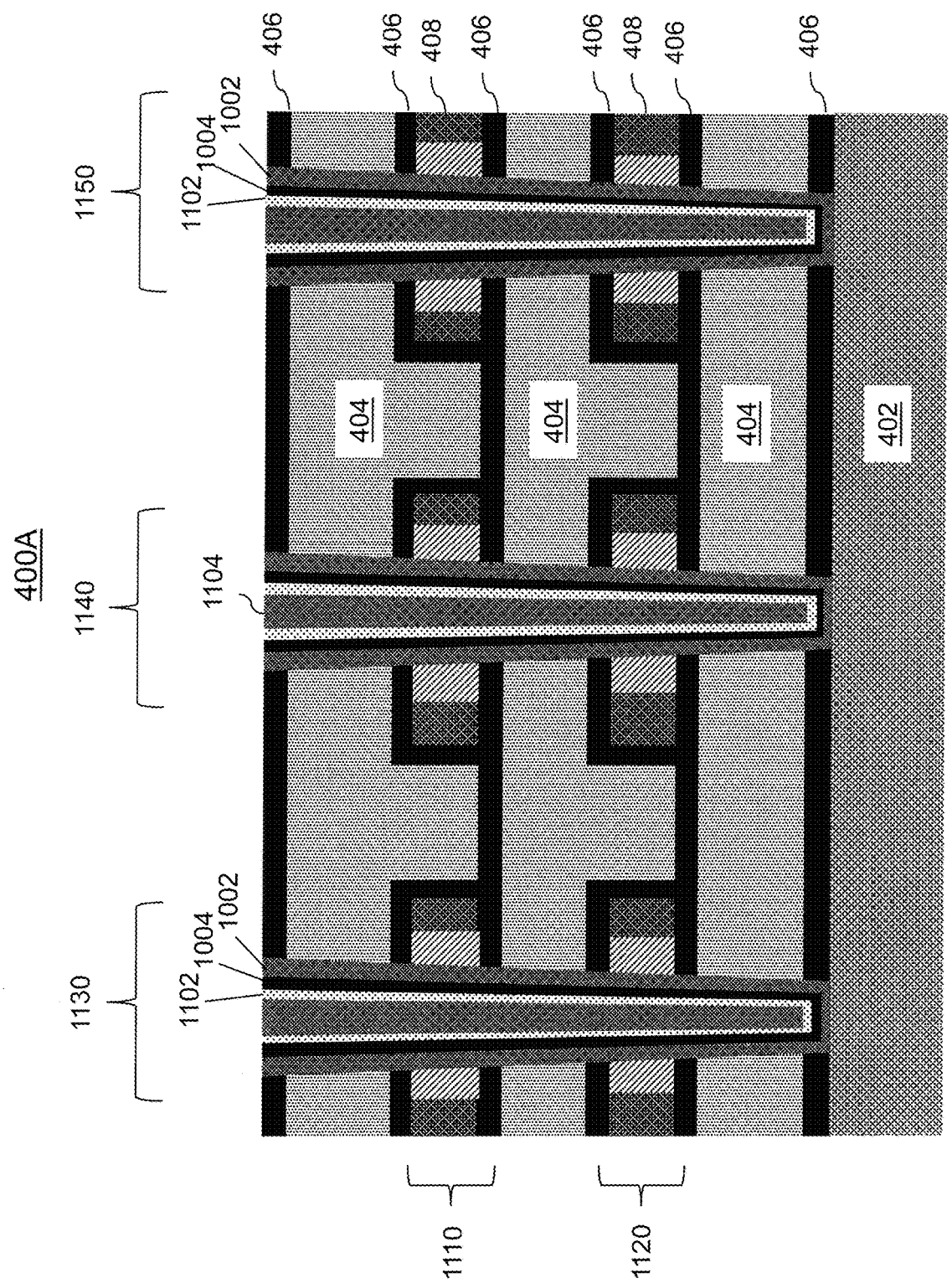

In FIG. 11, known fabrication operations have been applied to the structure 400 shown in FIG. 10 to form a structure 400A, which shows final versions of a portion of the 3D vertical ReRAM 300 (shown in FIG. 3). A third layer 1102 (barrier layer) has been formed on the second layer 1004 shown in FIG. 10. The third layer 1102 is a barrier layer, such as TaN similar to that used in the access plates, which is used to prevent the metal fill material 1104 from diffusing to the other layers that are in contact with the metal deposited in FIG. 11. In embodiments of the invention, the known fabrication operations include filling the trenches 604 (shown in FIG. 8) with a vertical electrode material 1104. In embodiments of the invention, the vertical electrode material 1104 is copper due to the favorable low resistivity properties. In embodiments of the invention, a chemical mechanical planarization (CMP) has been used to planarize a top surface of the vertical electrode material 1104. The structure 400A shows six ReRAM cells where a first row of cells 1110 includes three cells and a second row of cells 1120 includes three more cells. The structure 400A also includes three columns of cells 1130, 1140, and 1150. The intersection of a column and row identifies a particular cell in the structure 400A such as the cell at the intersection of the row 1110 and the column 1130. Each cell shown in the structure 400A includes the lateral electrode 802A and a portion of the vertical electrode material 1104 that corresponds to the lateral electrode 802A. In addition, each cell includes a portion of the layers 1002, 1004, and 1102 that lies within the region of the lateral electrode layer 802A.

Figure 12:
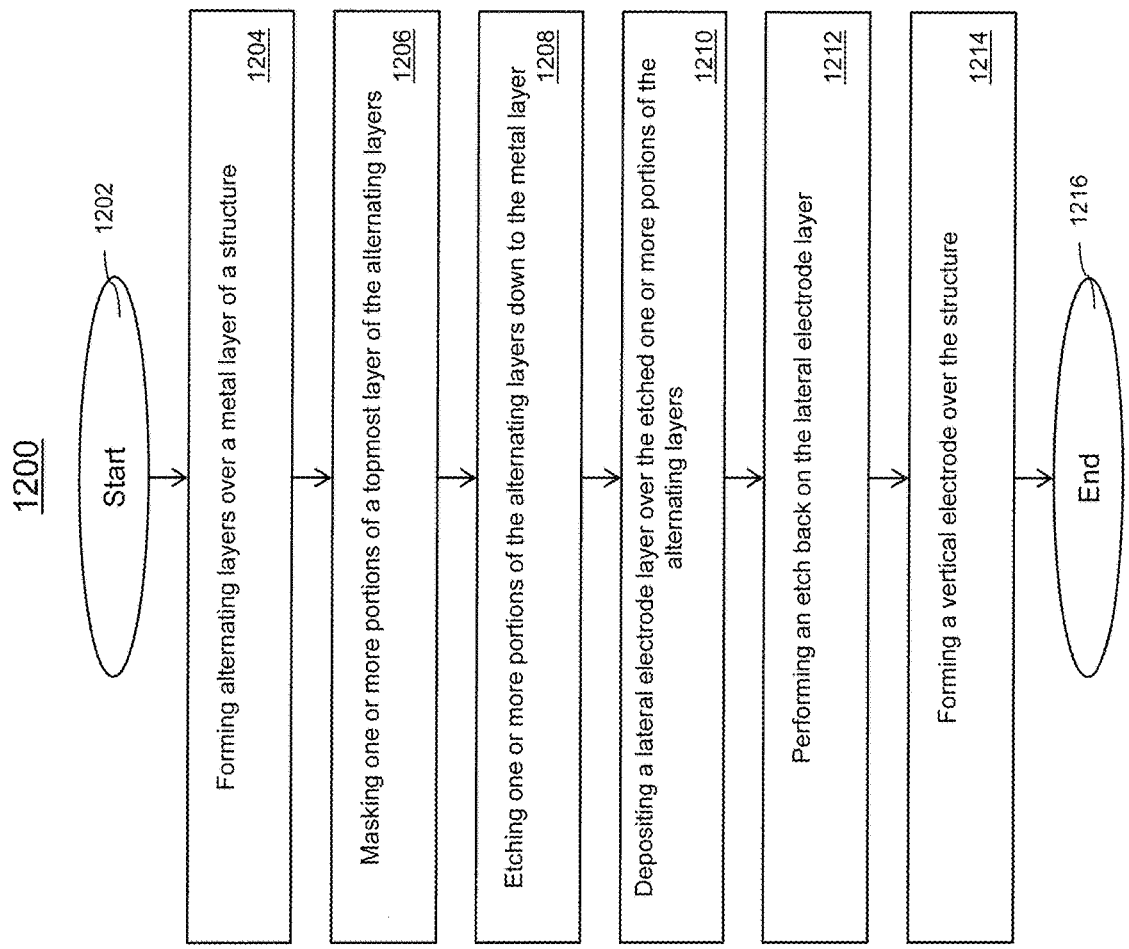
FIG. 12 depicts a flow chart of a method for forming structures that reduce metal resistance in ReRAM in accordance with one or more aspects of the invention.

FIG. 12 depicts a flow chart of a method 1200 for a fabrication operation for reducing the resistivity of a vertical ReRAM structure of a cross-bar array in accordance with one or more embodiments of the invention. The method 1200 beings at block 1202 and proceeds to block 1204 that provides for forming alternating layers over a metal layer. At block 1206, the method 1200 provides for masking one or more portions of a topmost layer of the alternating layers. In one or more embodiments of the invention, a hard mask is deposited to form trenches during an etching process.

Block 1208 provides for etching one or more portions of the alternating layers down to the metal layer. The etching process can include a first etching process to form the trench that extends down to the metal layer. Subsequently, a selective etch process is performed to recess the barrier layers and the second metal layer. The method 1200, at block 1210, provides for depositing a lateral electrode layer over the etched one or more portions of the alternating layers. In one or more embodiments of the invention, the lateral electrode layer is deposited to form the lateral electrode. The lateral electrode is a wrap-around lateral electrode and can be composed of TiN.

Block 1212 provides for performing an etch back on the lateral electrode layer. The lateral electrode layer is etched back to form a uniform surface in the trench to provide a surface to form the vertical electrode. The method 1200, at block 1214, provides for forming a vertical electrode over the structure. In one or more embodiments of the invention, the vertical electrode is composed of a plurality layers. The plurality of layers includes a transitional oxide layer, an alloy layer, a barrier layer, and a metal for the vertical electrode.

Embodiments of the invention improve over the prior art by reducing the metal resistivity used in the access plates and the vertical electrodes coupled to each ReRAM cell so that a uniform response of the plurality of ReRAM cells is realized. The variability in the conduction paths leading from the contact points to the cells cannot be so large as to render the operation of the ReRAM array inoperable. In effort to reduce the variability, at least based on metal resistivity of the conventional materials used in the array, the lateral and vertical electrodes materials have been replaced with copper which has a very low resistivity which increases the predictability and uniformity in the performance of the ReRAM array. The configuration provided by the techniques described herein allow for dense ReRAM arrays with reliable and consistent switching characteristics.

The techniques described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A resistive switching device comprising:
a lateral electrode coupled to an access plate, wherein the access plate comprises a low resistivity material, wherein the access plate is a copper access plate; and
a vertical electrode comprising a plurality of layers, wherein the lateral electrode surrounds one or more portions of the vertical electrode, wherein an intersection of the lateral electrode and the vertical electrode form a memory cell,
wherein the vertical electrode comprises a first transitional oxide layer, a second alloy layer on the transitional oxide layer, a barrier layer on the second alloy layer, and a metal layer on the barrier layer,
wherein the lateral electrode directly contacts the first transitional oxide layer of the vertical electrode and the copper access plate.

2. The resistive switching device of claim 1, wherein the first transitional oxide layer comprises silicon oxide.

3. The resistive switching device of claim 1, wherein the first transitional oxide layer is about 5-20 nm thick.

4. The resistive switching device of claim 1, wherein the second alloy layer comprises titanium aluminum carbon (TiAlC).

5. The resistive switching device of claim 1, wherein the barrier layer comprises tantalum nitride.

6. The resistive switching device of claim 1, wherein the lateral electrode forms a wrap-around electrode surrounding the vertical electrode.

7. The resistive switching device of claim 6, wherein the lateral electrode comprises titanium nitride.

8. The resistive switching device of claim 1, wherein the vertical electrode includes the first transitional oxide layer that is at least one of hafnium oxide or tantalum oxide.

9. The resistive switching device of claim 1, wherein the vertical electrode comprises copper.

10. A resistive random access memory structure comprising:
a plurality of vertical electrodes, wherein each vertical electrode comprises a first transitional oxide layer, a second alloy layer on the first transitional oxide layer, a barrier layer on the second alloy layer, and a metal layer on the barrier layer; and
a plurality of lateral electrodes, wherein a cross section of the vertical electrode and the lateral electrode forms active regions having a switchable conduction state, wherein the lateral electrode wraps-around the vertical electrode and wherein the lateral electrode and vertical electrode comprises a low resistivity conductor, wherein the lateral electrode directly contacts the vertical electrode and an access plate, wherein the access plate is a copper access plate; and
a plurality of active regions having a switchable conduction state.

11. The resistive random access memory structure of claim 10, wherein the first transitional oxide layer comprises silicon oxide.

12. The resistive random access memory structure of claim 10, wherein the first transitional oxide layer is about 5-20 nm thick.

13. The resistive random access memory structure of claim 10, wherein the second alloy layer comprises titanium aluminum carbon (TiAlC).

14. The resistive random access memory structure of claim 10, wherein the barrier layer comprises tantalum nitride.

15. The resistive random access memory structure of claim 10, wherein the switchable conduction state can be configured in a high conduction state and a low conduction state.

16. The resistive random access memory structure of claim 15, wherein the plurality of lateral electrodes comprise titanium nitride.

17. The resistive random access memory structure of claim 10, wherein the plurality of vertical electrodes include the first transitional oxide layer that is at least one of hafnium oxide or tantalum oxide.

18. The resistive random access memory structure of claim 10, wherein the plurality of vertical electrodes comprise copper.

* * * * *